United States Patent
Feng et al.

(10) Patent No.: US 12,401,071 B2
(45) Date of Patent: Aug. 26, 2025

(54) METHOD, APPARATUS, DEVICE, AND SYSTEM FOR MONITORING BATTERY PACK SAFETY AND STORAGE MEDIUM

(71) Applicant: CONTEMPORARY AMPEREX TECHNOLOGY (HONG KONG) LIMITED, Hong Kong (CN)

(72) Inventors: Shuangshi Feng, Ningde (CN); Hai Zou, Ningde (CN); Yi Qu, Ningde (CN); Shaoteng Ren, Ningde (CN); Hui Jia, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 490 days.

(21) Appl. No.: 17/942,027

(22) Filed: Sep. 9, 2022

(65) Prior Publication Data

US 2023/0046146 A1     Feb. 16, 2023

Related U.S. Application Data

(63) Continuation of application No. PCT/CN2022/096532, filed on Jun. 1, 2022.

(30) Foreign Application Priority Data

Aug. 9, 2021   (CN) .......................... 202110907630.7

(51) Int. Cl.
*H01M 10/42* (2006.01)
*H01M 10/48* (2006.01)

(52) U.S. Cl.
CPC ....... *H01M 10/4257* (2013.01); *H01M 10/48* (2013.01); *H01M 2010/4271* (2013.01)

(58) Field of Classification Search
CPC .......................... H01M 10/4257; H01M 10/48
See application file for complete search history.

(56) References Cited

U.S. PATENT DOCUMENTS

2011/0148359 A1   6/2011  Noguchi
2016/0209473 A1*  7/2016  You ...................... G01R 31/367

FOREIGN PATENT DOCUMENTS

CN       105572598 A      5/2016
CN       108631015 A     10/2018
(Continued)

OTHER PUBLICATIONS

International Search Report and Written Opinion, PCT/CN2022/096532, Aug. 10, 2022, 10 pgs.
(Continued)

*Primary Examiner* — Olatunji A Godo
(74) *Attorney, Agent, or Firm* — ANOVA LAW GROUP, PLLC (57) ABSTRACT

The present application discloses a method, apparatus, device, and system for monitoring battery pack safety. The method includes: obtaining, based on obtained stress data of a battery pack in an electric vehicle, stress energy information of the battery pack; determining a target-level alarm condition based on the stress energy information and sending corresponding alarm information, where the target-level alarm condition is a level of alarm condition in preset N levels of alarm conditions that the stress energy information satisfies, an $i^{th}$ level of alarm condition indicates that there are $m_i$ occurrences of impact energy represented by the stress energy information that is within an $i^{th}$ energy threshold range, and a lower limit of the $i^{th}$ energy threshold range of the $i^{th}$ level of alarm condition is greater than an upper limit of an $(i-1)^{th}$ energy threshold range of an $(i-1)^{th}$ level of alarm condition, and $m_i < m_{i-1}$.

13 Claims, 5 Drawing Sheets

(56) References Cited

FOREIGN PATENT DOCUMENTS

| CN | 108674216 A | 10/2018 |
|----|-------------|---------|
| CN | 110239348 A | 9/2019 |
| CN | 110926750 A | 3/2020 |
| CN | 112763136 A | 5/2021 |
| JP | H04188573 A | 7/1992 |
| JP | H05236602 A | 9/1993 |
| JP | H1140205 A | 2/1999 |
| JP | 2008091085 A | 4/2008 |
| JP | 2008535457 A | 8/2008 |
| JP | 2008300038 A | 12/2008 |
| JP | 2011009042 A | 1/2011 |
| JP | 2014203571 A | 10/2014 |
| JP | 2015047917 A | 3/2015 |
| JP | 2018072296 A | 5/2018 |
| JP | 2020114101 A | 7/2020 |

OTHER PUBLICATIONS

The European Patent Office (EPO) The Extended European Search Report for 22764637.9 Dec. 22, 2023 10 Pages.
The Japan Patent Office (JPO) Notification of Reasons for Refusal for Application No. 2022-556166 Oct. 24, 2023 18 Pages(including translation).
The Japan Patent Office (JPO) Decision of Refusal for Application No. 2022-556166 and Translation Feb. 28, 2024 7 Pages.

\* cited by examiner

METHOD, APPARATUS, DEVICE, AND SYSTEM FOR MONITORING BATTERY PACK SAFETY AND STORAGE MEDIUM

CROSS-REFERENCE TO RELATED APPLICATIONS

This application is a continuation application of PCT Patent Application No. PCT/CN2022/096532, entitled "METHOD, APPARATUS, DEVICE, AND SYSTEM FOR MONITORING BATTERY PACK SAFETY AND STORAGE MEDIUM" filed on Jun. 1, 2022, which claims priority to Chinese Patent Application No. 202110907630.7, filed with the State Intellectual Property Office of the People's Republic of China on Aug. 9, 2021, and entitled "METHOD, APPARATUS, DEVICE, AND SYSTEM FOR MONITORING BATTERY PACK SAFETY AND STORAGE MEDIUM", all of which are incorporated herein by reference in their entirety.

TECHNICAL FIELD

The present application belongs to the field of battery technologies, and in particular, to a method, apparatus, device, and system for monitoring battery pack safety and a storage medium.

BACKGROUND ART

With the development of new energy technologies, batteries are finding their application in more and more fields, for example, may be used as a power source to provide power for electric vehicles, so as to reduce the use of non-renewable resources.

For ease of installation, batteries may be installed in an electric vehicle in the form of a battery pack. When the electric vehicle travels in a harsh road condition, the battery pack may be damaged by impacts, scratches, and the like, which may destroy the structure and performance of the battery pack, resulting in a great safety risk of the battery pack.

SUMMARY OF THE INVENTION

Embodiments of the present application provide a method, apparatus, device, and system for monitoring battery pack safety and a storage medium, which can improve the safety of a battery pack.

According to a first aspect, an embodiment of the present application provides a method for monitoring battery pack safety, including: obtaining stress energy information of a battery pack in an electric vehicle based on obtained stress data of the battery pack, where the stress data is used to represent stress distribution of the bottom of the battery pack, and the stress energy information is used to represent impact energy on the bottom of the battery pack; and determining a target-level alarm condition based on the stress energy information and sending alarm information corresponding to the target-level alarm condition, where the target-level alarm condition is a level of alarm condition in preset N levels of alarm conditions that the stress energy information satisfies, an $i^{th}$ level of alarm condition in the N levels of alarm conditions includes that there are $m_i$ occurrences of impact energy represented by the stress energy information that is within an $i^{th}$ energy threshold range, N is a positive integer, and $0<i\leq N$. When N is a positive integer greater than 1 and $1<i\leq N$, a lower limit value of the $i^{th}$ energy threshold range corresponding to the $i^{th}$ level of alarm condition is greater than an upper limit value of an $(i-1)^{th}$ energy threshold range corresponding to an $(i-1)^{th}$ level of alarm condition, and $m_i<m_{i-1}$.

If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

In an implementation of the first aspect of the present application, the target-level alarm condition is the $i^{th}$ level of alarm condition. The determining a target-level alarm condition based on the stress energy information and sending alarm information corresponding to the target-level alarm condition includes: when the impact energy represented by the obtained stress energy information is within the $i^{th}$ energy threshold range, obtaining the cumulative number of risks corresponding to the $i^{th}$ energy threshold range, where the cumulative number of risks corresponding to the $i^{th}$ energy threshold range is used to indicate the number of occurrences of the impact energy represented by the stress energy information that is within the $i^{th}$ energy threshold range; and when the cumulative number of risks corresponding to the $i^{th}$ energy threshold range reaches $m_i$, sending alarm information corresponding to the $i^{th}$ level of alarm condition.

By obtaining the cumulative number of risks that the impact energy represented by the stress energy information is within each energy threshold range, the number of occurrences of the impact energy within each energy threshold range can be obtained, so that alarm information can be sent accurately and in a timely manner when the cumulative number of risks corresponding to the $i^{th}$ energy threshold range reaches $m_i$ in the $i^{th}$ level of alarm condition. In any one of the foregoing implementations of the first aspect of the present application, $m_N=1$.

$m_N$ corresponds to the highest level of alarm condition. The highest level of alarm condition is set for the most severe impact. Therefore, the higher the level of the alarm condition, the fewer times of occurrences of the impact energy that is required to be within the corresponding energy threshold range to trigger the sending of the alarm information. When the impact energy represented by the stress energy information reaches the standard of the most severe impact, a single impact may cause huge damage to the battery pack. A threshold for the number of occurrences within the corresponding energy threshold range in the highest level of alarm condition is set to 1, so that a high safety risk caused by the severe impact to the battery pack can be detected and handled in a timely manner.

In any one of the foregoing implementations of the first aspect of the present application, the obtaining stress energy information of a battery pack in an electric vehicle based on obtained stress data of the battery pack includes: when the stress data exceeds a normal change threshold range, obtaining the stress energy information of the battery pack based on the stress data.

If the stress data exceeds the normal change threshold range, it indicates that the bottom of the battery pack is impacted. The stress energy information of the battery pack can be obtained through a conversion performed only when the bottom of the battery pack is impacted, so that stress energy information necessary for monitoring battery pack safety is obtained, and stress energy information unnecessary for monitoring battery pack safety does not need to be obtained, which can reduce resources, such as storage resources and computing resources, occupied by battery pack safety monitoring.

In any one of the foregoing implementations of the first aspect of the present application, before the obtaining stress energy information of a battery pack in an electric vehicle based on obtained stress data of the battery pack, the method further includes: obtaining stress data; when the number of pieces of cached stress data is less than a predetermined number threshold, caching the stress data obtained this time; and when the number of pieces of cached stress data is greater than or equal to the predetermined number threshold, deleting the first obtained stress data, and caching the stress data obtained this time.

Through a comparison between the number of pieces of cached stress data and the predetermined number threshold, optionally, the last obtained stress data may be directly cashed, or the first obtained stress data may be deleted and the last obtained stress data may be cached, so as to ensure that other cache resources are not occupied except the cache resources set for caching the stress data, thereby saving cache resources.

In any one of the foregoing implementations of the first aspect of the present application, the stress data includes one or more of the following: fluctuation data, pressure data, and acceleration data, where the fluctuation data is used to represent a mechanical wave impacting the bottom of the battery pack, the pressure data is used to represent force on the bottom of the battery pack, and the acceleration data is used to represent acceleration of the battery pack in a direction perpendicular to the bottom of the battery pack.

In any one of the foregoing implementations of the first aspect of the present application, safety status information of the battery pack is uploaded to a cloud data center, where the safety status information of the battery pack includes the stress energy information and/or the alarm information corresponding to the target-level alarm condition.

Through data exchange with the cloud data center, the cloud data center may learn of the safety status of the battery pack. The cloud data center may further take specific measures based on the safety status of the battery pack, to implement the maintenance of the battery pack.

In any one of the foregoing implementations of the first aspect of the present application, the stress energy information includes stress energy, and the stress energy information further includes a stress position.

According to a second aspect, an embodiment of the present application provides an apparatus for monitoring battery pack safety, including: a calculation module configured to obtain stress energy information of a battery pack in an electric vehicle based on obtained stress data of the battery pack, where the stress data is used to represent stress distribution of the bottom of the battery pack, and the stress energy information is used to represent impact energy on the bottom of the battery pack; and an alarm module configured to determine a target-level alarm condition based on the stress energy information and send alarm information corresponding to the target-level alarm condition, where the target-level alarm condition is a level of alarm condition in preset N levels of alarm conditions that the stress energy information satisfies, an $i^{th}$ level of alarm condition in the N levels of alarm conditions includes that there are $m_i$ occurrences of the impact energy represented by the stress energy information that is within an $i^{th}$ energy threshold range, N is a positive integer, and $0<i\leq N$, where when N is a positive integer greater than 1 and $1<i\leq N$, a lower limit value of the $i^{th}$ energy threshold range corresponding to the $i^{th}$ level of alarm condition is greater than an upper limit value of an $(i-1)^{th}$ energy threshold range corresponding to an $(i-1)^{th}$ level of alarm condition, and $m_i<m_{i-1}$.

If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

According to a third aspect, an embodiment of the present application provides a system for monitoring battery pack safety, including: a sensor provided at the bottom of a battery pack and configured to collect stress data of the battery pack, where the stress data is used to represent stress distribution of the bottom of the battery pack, and the battery pack is located in an electric vehicle; a controller communicatively connected to the sensor and configured to obtain the stress data from the sensor and obtain stress energy information of the battery pack based on the stress data, where the stress energy information is used to represent impact energy on the bottom of the battery pack; and a vehicle control unit communicatively connected to the controller and configured to determine a target-level alarm condition based on the stress energy information and send alarm information corresponding to the target-level alarm condition, where the target-level alarm condition is a level of alarm condition in preset N levels of alarm conditions that the stress energy information satisfies, an $i^{th}$ level of alarm condition in the N levels of alarm conditions includes that there are $m_i$ occurrences of the impact energy represented by the stress energy information that is within an $i^{th}$ energy threshold range, N is a positive integer, and $0<i\leq N$, where when N is a positive integer greater than 1 and $1<i\leq N$, a lower limit value of the $i^{th}$ energy threshold range corresponding to the $i^{th}$ level of alarm condition is greater than an upper limit value of an $(i-1)^{th}$ energy threshold range corresponding to an $(i-1)^{th}$ level of alarm condition, and $m_i<m_{i-1}$.

If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

In an implementation of the third aspect of the present application, the system further includes: a cloud data center communicatively connected to the vehicle control unit and configured to obtain safety status information of the battery pack from the vehicle control unit, where the safety status information of the battery pack includes the stress energy information and/or the alarm information corresponding to the target-level alarm condition.

According to a fourth aspect, an embodiment of the present application provides a device for monitoring battery pack safety, including: a processor and a memory storing computer program instructions, where the computer program instructions, when executed by the processor, implement the method for monitoring battery pack safety in the first aspect.

If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

According to a fifth aspect, an embodiment of the present application provides a computer-readable storage medium storing computer program instructions, where the computer program instructions, when executed by a processor, implement the method for monitoring battery pack safety in the second aspect.

If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

The embodiments of the present application provide the method, apparatus, device, and system for monitoring battery pack safety and the storage medium, so that the stress energy information for ensuring the energy generated by the force on the bottom of the battery pack is obtained based on the stress data of the battery pack that can ensure the stress distribution of the bottom of the battery pack. A level of alarm condition that the stress energy satisfies, that is, the target-level alarm condition, is determined based on the stress energy information, so that the alarm information corresponding to the target-level alarm condition is sent. If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack.

BRIEF DESCRIPTION OF THE DRAWINGS

In order to more clearly illustrate the technical solutions of the embodiments of the present application, the accompanying drawings to be used in the embodiments of the present application are described briefly below. For those of ordinary skill in the art, other drawings may also be obtained according to these drawings without the inventive labor.

DETAILED DESCRIPTION OF EMBODIMENTS

Features and exemplary embodiments of various aspects of the present application are described in detail below. To make the objectives, technical solutions, and advantages of the present application clearer and more comprehensible, the following further describes the present application in detail with reference to the accompanying drawings and specific embodiments. It should be understood that the specific embodiments described herein are merely intended to explain the present application, and are not intended to limit the present application. For those skilled in the art, the present application may be implemented in a case where some of these specific details are not required. The following description of the embodiments is merely used to provide a better understanding of the present application by illustrating examples of the present application.

With the development of new energy technologies, batteries are finding their application in more and more fields, for example, batteries may be used as a power source to provide power for electric vehicles. For ease of installation, batteries may be installed in an electric vehicle in the form of a battery pack. Specifically, the battery pack may be installed at the bottom of the electric vehicle. In some examples, the battery pack may serve as the chassis of the electric vehicle. When the electric vehicle travels in some relatively harsh road conditions, the battery pack may be damaged by impacts, scratches, and the like, which may destroy the structure and performance of the battery pack, and may cause problems such as battery pack fires and explosions, resulting in a great safety risk.

The present application provides a method, apparatus, device, and system for monitoring battery pack safety and a storage medium, to determine, based on impact energy on the bottom of a battery pack installed in an electric vehicle, whether to send alarm information to prompt that the battery pack has a risk. The method, apparatus, device, and system for monitoring battery pack safety and the storage medium provided in the present application are described in detail below.

Figure 1:
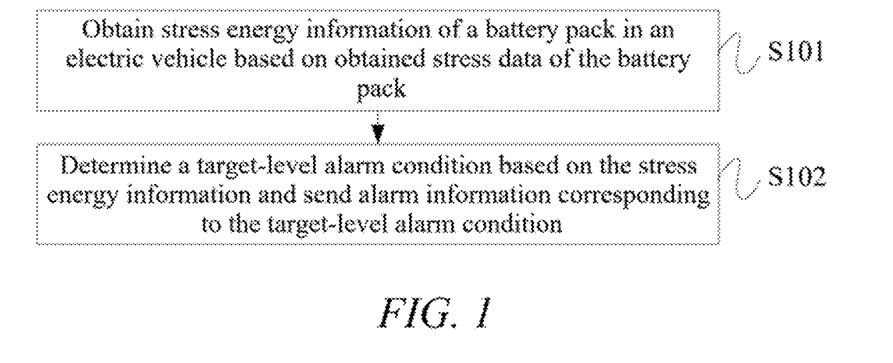
FIG. 1 is a flowchart of a method for monitoring battery pack safety according to an embodiment of the present application.

The present application provides a method for monitoring battery pack safety, which may be performed by an apparatus for monitoring battery pack safety, a device for monitoring battery pack safety, a controller, or the like. The apparatus for monitoring battery pack safety, the device for monitoring battery pack safety, the controller, or the like may be installed in an electric vehicle, which is not limited herein. FIG. 1 is a flowchart of a method for monitoring battery pack safety according to an embodiment of the present application. As shown in FIG. 1, the method for monitoring battery pack safety may include steps S101 and S102.

In step S101, stress energy information of a battery pack in an electric vehicle is obtained based on obtained stress data of the battery pack.

The stress data is used to represent stress distribution of the bottom of the battery pack. The stress distribution of the bottom of the battery pack may include force on the bottom of the battery pack and distribution of the force. A sensor may be provided on the battery pack, and the stress data of the battery pack may be obtained by using the sensor. The sensor may collect stress data in real time. The sensor may collect stress data during traveling or parking of an electric vehicle. The number and types of sensors and installation positions of the sensors on a battery pack are not limited herein. The stress data may correspond to the type of the sensors. For example, the sensor may include one or more of a piezoelectric sensor, an acceleration sensor, and other sensors, which is not limited herein. Correspondingly, the stress data may include pressure data and/or acceleration data, that is, the stress data may include one or more of fluctuation data, pressure data, acceleration data, and the like, which is not limited herein. The fluctuation data may be used to represent a mechanical wave impacting the bottom of the battery pack. The pressure data may be used to represent force on the bottom of the battery pack. The acceleration data is used to represent acceleration of the battery pack in a direction perpendicular to the bottom of the battery pack. When the bottom of the battery pack is impacted, the stress data may reflect impact force on the bottom of the battery pack. The force on the bottom of the battery pack and the distribution of the force may be determined in conjunction with the positions of the sensors. Since the battery pack is located at the bottom of the electric vehicle, the battery pack suffers more impacts in the vertical direction, that is, a direction perpendicular to the bottom of the battery pack, so that the impact on the bottom of the battery pack may be reflected more accurately based on one or more of a mechanical wave on the bottom of the battery pack in the vertical direction, force on the bottom of the battery pack in the vertical direction, and acceleration of the bottom of the battery pack in the vertical direction.

Figure 2:
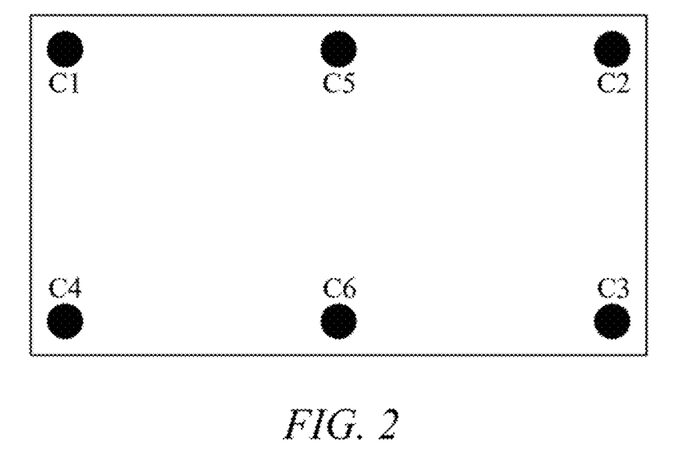
FIG. 2 is a schematic diagram of an example in which sensors are distributed at the bottom of a battery pack according to an embodiment of the present application.

In some examples, a plurality of sensors may be provided at the bottom of the battery pack. The sensors may be evenly provided at the bottom of the battery pack, which is more beneficial to representation of stress distribution of the bottom of the battery pack by the stress data. For example, FIG. 2 is a schematic diagram of an example in which sensors are distributed at the bottom of a battery pack according to an embodiment of the present application. As shown in FIG. 2, 6 sensors C1 to C6 are provided at the bottom of the battery pack. The sensors C1 to C4 are arranged at the four vertexes of the bottom of the battery pack, the sensor C5 is arranged on an edge of the bottom of the battery pack and between the sensors C1 and C2, and the sensor C6 is arranged on an edge of the bottom of the battery pack and between the sensors C3 and C4. The stress distribution of the bottom of the battery pack may be learned based on stress data collected by the sensors C1 to C6.

The stress energy information is used to represent impact energy on the bottom of the battery pack. The impact energy on the bottom of the battery pack, that is, the stress energy information, may be obtained through a conversion calculation performed on the stress distribution of the bottom of the battery pack that is represented by the stress data. Specifically, the stress energy information may include stress energy. The stress energy information may further include a stress position, which is not limited herein.

In some examples, stress data at a moment may be converted to obtain stress energy information at this moment.

In some other examples, since the impact is a transitory fluctuation process, a time period for the transitory fluctuation of the impact may be less than 1 second. Therefore, impact energy on the bottom of the battery pack in a continuous impact process may be obtained through a conversion calculation performed on stress data in the impact process. In other words, stress data of the battery pack that is obtained within a period of time may be converted to obtain stress energy information of the battery pack within the period of time. Correspondingly, the obtained stress data may be cached first, so as to perform a conversion calculation on the stress data in the impact process to obtain the impact energy on the bottom of the battery pack in the impact process.

In some examples, stress energy information of the battery pack may be obtained in real time based on stress data of the battery pack. The stress energy information of the battery pack may be selectively stored to save memory space. The stress energy information of the battery pack that is stored may be used in a subsequent process of determining a target-level alarm condition. For example, the stress energy information for which the represented impact energy is greater than a minimum threshold of impact damage may be stored, and the minimum threshold of impact damage is a minimum value of impact energy on the battery pack. The stress energy information for which the represented impact energy is greater than the minimum threshold of impact damage may be considered as stress energy information that is obtained when the battery pack is impacted and the impact has an adverse effect on the safety of the battery pack. Such stress energy information is necessary for monitoring battery pack safety, and therefore stress energy information unnecessary for monitoring battery pack safety may be removed.

Figure 3:
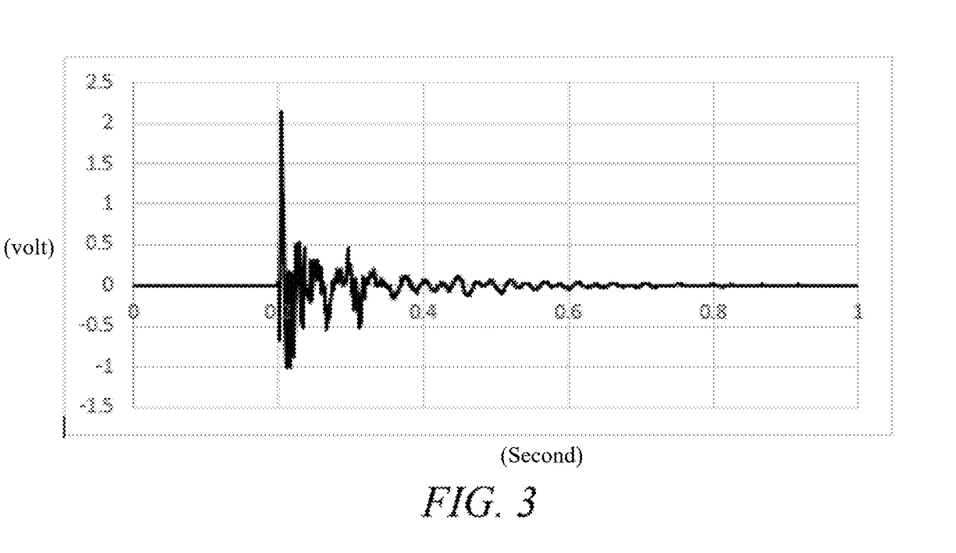
FIG. 3 is a schematic diagram of an example in which stress data changes with time according to an embodiment of the present application.

In some other examples, to prevent the stress energy information of the battery pack that is obtained based on the stress data of the battery pack from occupying too many resources, such as storage resources, computing resources, and the like, the stress energy information of the battery pack may be obtained based on stress data that exceeds a normal change threshold range. When the bottom of the battery pack is impacted, stress data of the battery pack may fluctuate greatly and exceed the normal change threshold range. The normal change threshold range is a change range of stress data obtained when the bottom of the battery pack is not impacted, and may be set according to scenarios, requirements, and experience, which is not limited herein. Impact energy represented by stress energy information that is obtained by converting the upper limit of the normal change threshold range may be the minimum threshold of impact damage, that is, only stress data obtained when impact energy represented by stress energy information that is obtained through a conversion and that can be greater than the minimum threshold of impact damage can be used for conversion. If the stress data exceeds the normal change threshold range, it indicates that the bottom of the battery pack is impacted. The stress energy information of the battery pack can be obtained through a conversion performed only when the bottom of the battery pack is impacted, so that stress energy information necessary for monitoring battery pack safety is obtained, and stress energy information unnecessary for monitoring battery pack safety does not need to be obtained. For example, FIG. 3 is a schematic diagram of an example in which stress data changes with time according to an embodiment of the present application. As shown in FIG. 3, the horizontal coordinate axis represents time (in seconds), and the vertical coordinate axis represents stress data. At about 0.2 seconds, the battery pack is impacted, and the stress data fluctuates greatly and exceeds the normal change threshold range. Correspondingly, stress energy information can be obtained based on the stress data collected at about 0.2 seconds.

The stress energy information unnecessary for monitoring battery pack safety is not obtained, and the stress energy information necessary for monitoring battery pack safety is used to monitoring battery pack safety, which can reduce resources, such as storage resources and computing resources, occupied by battery pack safety monitoring.

In step S102, a target-level alarm condition is determined based on the stress energy information and alarm information corresponding to the target-level alarm condition is sent.

The target-level alarm condition is a level of alarm condition in preset N levels of alarm conditions that the stress energy information satisfies. An $i^{th}$ level of alarm condition in the N levels of alarm conditions includes that there are $m_i$ occurrences of the impact energy represented by the stress energy information that is within an $i^{th}$ energy threshold range, N is a positive integer, and $0 < i \le N$. If there are $m_i$ occurrences of the impact energy represented by the stress energy information that is within the $i^{th}$ energy threshold range, the $i^{th}$ level of alarm condition is determined as the target-level alarm condition.

When N=1, only one level of alarm condition is set. A value of $m_1$ corresponding to a first-level alarm condition is not limited herein, and may be set to 1 or another value. When a first energy threshold range corresponding to the first-level alarm condition represents an extremely high safety risk, $m_1$=1, that is, once the impact energy represented by the stress energy information is within the first energy threshold range, the alarm information corresponding to the first-level alarm condition is sent. The alarm information may be implemented in the form of text, an image, a sound, indicator light, or the like, which is not limited herein.

When N is a positive integer greater than 1, two or more levels of alarm conditions are set. When N is a positive integer greater than 1 and $1 < i \le N$, a lower limit value of the $i^{th}$ energy threshold range corresponding to the $i^{th}$ level of alarm condition is greater than an upper limit value of an $(i-1)^{th}$ energy threshold range corresponding to an $(i-1)^{th}$ level of alarm condition, and $m_i < m_{i-1}$. A higher level of alarm condition indicates a higher safety risk corresponding to the alarm condition. Accumulation of a plurality of low-safety-risk impacts to a specific degree may result in a high safety risk. Therefore, the higher the level of the alarm condition, the fewer times of occurrences of the impact energy that is required to be within the corresponding energy threshold range to trigger the sending of the alarm information. In other words, a safety risk corresponding to the $i^{th}$ level of alarm condition is higher than that corresponding to the $(i-1)^{th}$ level of alarm condition. An energy threshold range corresponding to each level of alarm condition may be set according to scenarios, requirements, experience, and the like, which is not limited herein.

For example, N=2. Correspondingly, a first-level alarm condition and a second-level alarm condition are set. A first energy threshold range corresponding to the first-level alarm condition may be set to [100 J, 200 J), and a second energy threshold range corresponding to the second-level alarm condition may be [200 J, +∞), where J represents the unit joule. In other words, a lower limit value of the second energy threshold range corresponding to the second-level alarm condition is greater than an upper limit value of the first energy threshold range corresponding to the first-level alarm condition. A lower limit value of the first energy threshold range may be an energy threshold used to determine whether a case of the battery pack is deformed. If the impact energy represented by the stress energy information is within the first energy threshold range, it indicates that the case of the battery is deformed, and there is a safety risk but the safety risk is relatively low, that is, the battery pack has a relatively low failure risk and the battery pack may continuously operate normally. The lower limit value of the second energy threshold range may be an energy threshold used to determine whether the battery pack is seriously damaged from the inside. If the impact energy represented by the stress energy information is within the second energy threshold range, it indicates that the battery pack is seriously damaged from the inside, and the electric vehicle needs to be stopped for repair, replacement, and other handling of the battery pack. $m_1$ corresponding to the first-level alarm condition is greater than $m_2$ corresponding to the second-level alarm condition, for example, $m_1$=20 and $m_2$=1. In other words, when the number of occurrences of the impact energy represented by the stress energy information that is within the first energy threshold range, that is, the number of occurrences of low safety risks reaches 20, a safety risk of the battery pack increases, and an alarm needs to be given through the alarm information. However, when the number of occurrences of the impact energy represented by the stress energy information that is within the second energy threshold range, that is, the number of occurrences of high safety risks reaches 1, an alarm needs to be given through the alarm information.

For another example, N=3. Correspondingly, a first-level alarm condition, a second-level alarm condition, and a third-level alarm condition are set. A first energy threshold range corresponding to the first-level alarm condition may be set to [100 J, 150 J), a second energy threshold range corresponding to the second-level alarm condition may be [150 J, 200), and a third energy threshold range corresponding to the third-level alarm condition may be [200 J, +∞). In other words, a lower limit value of the third energy threshold range corresponding to the third-level alarm condition is greater than an upper limit value of the second energy threshold range corresponding to the second-level alarm condition, and a lower limit value of the second energy threshold range corresponding to the second-level alarm condition is greater than an upper limit value of the first energy threshold range corresponding to the first-level alarm condition. A lower limit value of the first energy threshold range may be an energy threshold used to determine whether a case of the battery pack is deformed. If the impact energy represented by the stress energy information is within the first energy threshold range, it indicates that the case of the battery is deformed, and there is a low safety risk, that is, the battery pack has a relatively low failure risk and the battery pack may continuously operate normally. A lower limit value of the second energy threshold range may be an energy threshold used to determine whether a case of the battery pack is deformed and there is a medium safety risk. If the impact energy represented by the stress energy information is within the second energy threshold range, it indicates that the case of the battery is deformed, and there is a medium safety risk, that is, the battery pack has a medium failure risk and the battery pack may continuously operate normally. The lower limit value of the third energy threshold range may be an energy threshold used to determine whether the battery pack is seriously damaged from the inside. If the impact energy represented by the stress energy information is within the third energy threshold range, it indicates that the battery pack is seriously damaged from the inside, and the electric vehicle needs to be stopped for repair, replacement, and other handling of the battery pack. $m_1$ corresponding to the first-level alarm condition is greater than $m_2$ corresponding to the second-level alarm condition, and $m_2$ corresponding to the second-level alarm condition is greater than $m_3$ corresponding to the third-level alarm condition, for example, $m_1$=20, $m_2$=15, and $m_3$=1. In other words, when the number of occurrences of the impact energy represented by the stress energy information that is within the first energy threshold range, that is, the number of occurrences of low safety risks reaches 20, a safety risk of the battery pack is a high risk, and an alarm needs to be given through the alarm information; when the number of occurrences of the impact energy represented by the stress energy information that is within the second energy threshold range, that is, the number of occurrences of medium safety risks reaches 15, a safety risk of the battery pack is a high risk, and an alarm needs to be given through the alarm information; and however, when the number of occurrences of the impact energy represented by the stress energy information that is within the third energy threshold range, that is, the number of occurrences of high safety risks reaches 1, an alarm needs to be given through the alarm information.

Values of N, the energy threshold range, and the like in the foregoing embodiments may be set according to scenarios, requirements, experience, and the like, which is not limited herein. In some examples, if the $N^{th}$ level of alarm condition corresponds to an extremely high safety risk, $m_N$ may be set to 1, that is, $m_N$=1, such that responses can be made to the extremely high safety risk of the battery pack in a timely manner for handling, thereby preventing the battery pack from fires, explosions, and other hazardous situations, lowering the safety risk of the battery pack, improving the safety of the battery pack, and avoiding damage to the electric vehicle, the driver, and passengers.

The number of occurrences of the impact energy represented by the stress energy information that is within each energy threshold range may be obtained, to update the number of occurrences of the impact energy represented by the stress energy information that is within each energy threshold range, that is, the cumulative number of risks corresponding to each level of alarm condition. The cumulative number of risks is used to indicate the number of occurrences of the energy represented by the stress energy information that is within the corresponding energy threshold range. For example, the cumulative number of risks corresponding to the $i^{th}$ energy threshold range is used to indicate the number of occurrences of the impact energy represented by the stress energy information that is within the $i^{th}$ energy threshold range, that is, the cumulative number of risks corresponding to the $i^{th}$ level of alarm condition is the number of occurrences of the energy represented by the stress energy information that is within the $i^{th}$ energy threshold range. Specifically, when the impact energy represented by the obtained stress energy information is within the $i^{th}$ energy threshold range, the cumulative number of risks corresponding to the $i^{th}$ energy threshold range is obtained. When the cumulative number of risks corresponding to the $i^{th}$ energy threshold range reaches that is, when the target-level alarm condition is the $i^{th}$ level of alarm condition, alarm information corresponding to the $i^{th}$ level of alarm condition is sent. A step size for the accumulation is 1, that is, when there is one occurrence of the impact energy represented by the stress energy information that is within the $i^{th}$ energy threshold range, the cumulative number of risks corresponding to the $i^{th}$ energy threshold range is incremented by 1.

In some examples, alarm information corresponding to different levels of alarm conditions may be the same or different, which is not limited herein. The alarm information may be transmitted to a related structure in the electric vehicle, and the related structure may give an alarm based on the alarm information, to notify related personnel that the battery pack has a high safety risk. An alarm mode is not limited herein, and may be implemented by means of display, sound, or the like. For example, the electric vehicle has a central control display screen or a central control panel. When there are $m_i$ occurrences of the impact energy represented by the stress energy information that is within the $i^{th}$ energy threshold range, the central control display screen or the central control panel may display an impact fault alarm identification. For another example, the electric vehicle has a buzzer. When there are $m_i$ occurrences of the impact energy represented by the stress energy information that is within the $i^{th}$ energy threshold range, the buzzer gives an alarm by making a buzzing sound.

In some examples, alarms corresponding to alarm information for different levels of alarm conditions may be different. For example, when an alarm is given by displaying an impact fault alarm identification, fault alarm identifications corresponding to alarm information for different levels of alarm conditions may also be different. For another example, when the alarm is given by making a buzzing sound, buzzing sounds corresponding to alarm information for different levels of alarm conditions may be different.

In some examples, an intense degree of an alarm corresponding to the alarm information for the $i^{th}$ level of alarm condition may be higher than that of an alarm corresponding to the alarm information for the $(i-1)^{th}$ level of alarm condition. For example, when an alarm corresponding to the alarm information for the $(i-1)^{th}$ level of alarm condition is given by making a buzzing sound, a buzzing sound of the alarm corresponding to the alarm information for the $i^{th}$ level of alarm condition may be higher or greater than the buzzing sound of the alarm corresponding to the alarm information for the $(i-1)^{th}$ level of alarm condition.

In some cases, when i<N, and there is one occurrence of the impact energy represented by the stress energy information that is within the $i^{th}$ energy threshold range, prompt information may alternatively be sent, where the prompt information is used to prompt that the battery pack has a low safety risk, so that a user or working personnel can obtain a status of the battery pack in a timely manner. A prompt level represented by the prompt information is lower than that represented by the alarm information in the foregoing embodiment.

In this embodiment of the present application, the stress energy information for ensuring the energy generated by the force on the bottom of the battery pack is obtained based on the stress data of the battery pack that can ensure the stress distribution of the bottom of the battery pack. A level of alarm condition that the stress energy satisfies, that is, the target-level alarm condition, is determined based on the stress energy information, so that the alarm information corresponding to the target-level alarm condition is sent. If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

Figure 4:
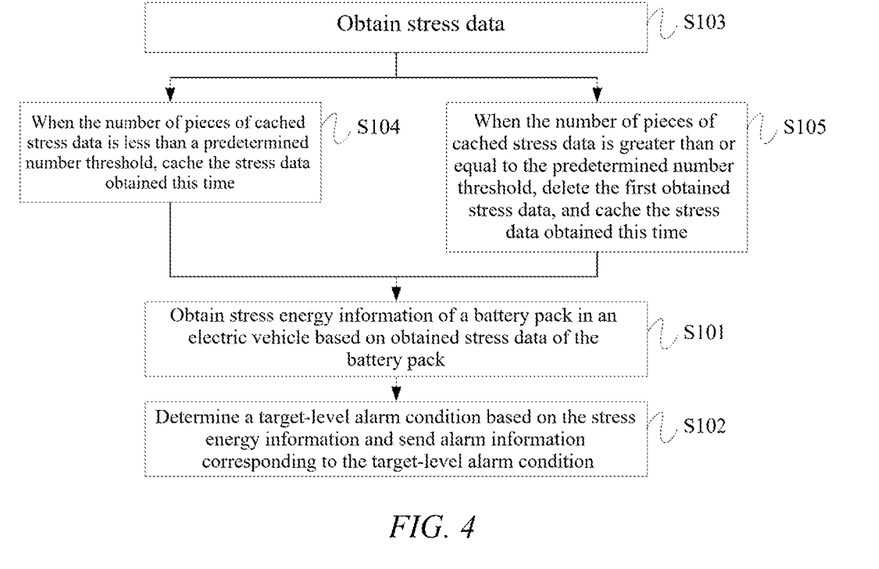
FIG. 4 is a flowchart of a method for monitoring battery pack safety according to another embodiment of the present application.

In some embodiments, to facilitate safety monitoring of the battery pack, the stress data collected by the sensor may be cached first. Since the sensor periodically collects stress data, an amount of the stress data is large. To further reduce cache resources occupied by stress data, only part of the stress data may be cached. FIG. 4 is a flowchart of a method for monitoring battery pack safety according to another embodiment of the present application. A difference between FIG. 4 and FIG. 1 lies in that, the method for monitoring battery pack safety illustrated in FIG. 4 may further include steps S103 to S105.

In step S103, stress data is obtained.

In step S104, when the number of pieces of cached stress data is less than a predetermined number threshold, the stress data obtained this time is cached.

After the stress data is obtained, the number of pieces of cached stress data may be compared with a predetermined number threshold. The predetermined number threshold is a number threshold set for limiting cache resources to be occupied for caching the stress data, may be set according to scenarios, requirements, experience, and the like, and is not limited herein. If the number of pieces of cached stress data is less than the predetermined number threshold, it indicates that the cache resources set for caching the stress data are relatively sufficient, and the stress data may continue to be cached directly.

In step S105, when the number of pieces of cached stress data is greater than or equal to the predetermined number threshold, the first obtained stress data is deleted, and the stress data obtained this time is cached.

If the number of pieces of cached stress data is greater than or equal to the predetermined number threshold, it indicates that cache resources set for caching the stress data are not sufficient. To cache the last obtained stress data, it is required that the first obtained stress data be deleted to cache the last obtained stress data, so as to ensure that other cache resources are not occupied except the cache resources set for caching the stress data, thereby saving cache resources.

For example, a period for the sensor to collect stress data is 0.001 seconds, and the predetermined number threshold is 1000 for each sensor. Table 1 shows stress data cached at 1 second, and Table 2 shows stress data cached at 1.001 seconds.

TABLE 1

| | | Cached Stress Data | | | |
|---|---|---|---|---|---|
| No. | Time (seconds) | Sensor 1 | Sensor 2 | Sensor 3 | Sensor 4 |
| 1 | 0.001 | 0.01 | 0.02 | 0.03 | 0.04 |
| 2 | 0.002 | 0.015 | 0.01 | 0.025 | 0.02 |
| 3 | 0.003 | 0 | 0.02 | 0.03 | 0.01 |
| ... | ... | ... | ... | ... | ... |
| ... | ... | ... | ... | ... | ... |
| 999 | 0.999 | 0 | 0.01 | 0 | 0.01 |
| 1000 | 1.000 | 0.01 | 0.02 | 0.01 | 0.03 |

TABLE 2

| | | Cached Stress Data | | | |
|---|---|---|---|---|---|
| No. | Time (seconds) | Sensor 1 | Sensor 2 | Sensor 3 | Sensor 4 |
| 1 | 0.002 | 0.015 | 0.01 | 0.025 | 0.02 |
| 2 | 0.003 | 0 | 0.02 | 0.03 | 0.01 |
| 3 | 0.004 | −0.015 | 0.015 | −0.015 | −0.01 |
| ... | ... | ... | ... | ... | ... |
| ... | ... | ... | ... | ... | ... |
| 999 | 1.000 | 0.01 | 0.02 | 0.01 | 0.03 |
| 1000 | 1.001 | 0.015 | 0.02 | 0.02 | 0.015 |

It may be learned from Table 1 and Table 2 that, the stress data collected at 1.001 seconds is cached, and the stress data first collected at 0.001 seconds is deleted. Through limited caching of the stress data, cache resources occupied by the stress data are reduced. In addition, since the first obtained stress data is deleted, there are no adverse effects on subsequent monitoring of battery pack safety.

Figure 5:
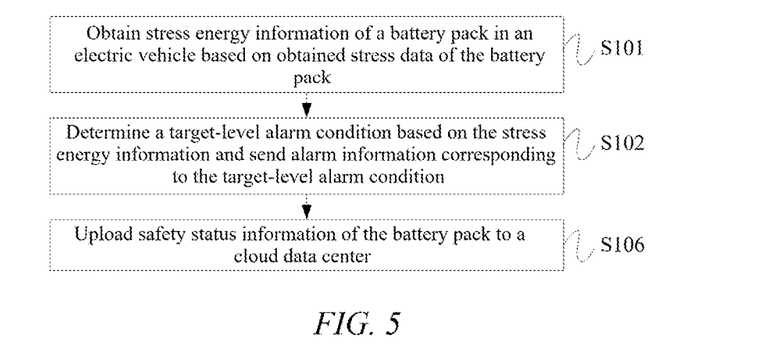
FIG. 5 is a flowchart of a method for monitoring battery pack safety according to still another embodiment of the present application.

In some embodiments, the stress energy information, the alarm information, and the like may also be uploaded to a cloud data center, so as to record a safety monitoring status of the battery pack. FIG. 5 is a flowchart of a method for monitoring battery pack safety according to still another embodiment of the present application. A difference between FIG. 5 and FIG. 1 lies in that, the method for monitoring battery pack safety illustrated in FIG. 5 may further include step S106.

In step S106, safety status information of the battery pack is uploaded to a cloud data center.

The cloud data center may include a cloud data center of an electric vehicle manufacturer, a cloud data center of a battery pack manufacturer, or the like, which is not limited herein. The safety status information of the battery pack is used to ensure a safety status of the battery pack, and may include the stress energy information and/or the alarm information corresponding to the target-level alarm condition, or the like, which is not limited herein. In some examples, the safety status information of the battery pack may further include the prompt information in the foregoing embodiment, which is not limited herein.

In some examples, the cloud data center may estimate and check the safety status of the electric vehicle, the battery pack, and the like based on the received stress energy information and/or alarm information corresponding to the target-level alarm condition. In some examples, the safety status information of the battery pack may further include positioning information and the like of the battery pack. After receiving the alarm information in the safety status information of the battery pack, the cloud data center may further determine a position of the battery pack based on the positioning information of the battery pack, and send a notification message to a terminal device of a maintenance service provider close to the battery pack, to instruct the maintenance service provider to provide maintenance services.

Through data exchange with the cloud data center, the cloud data center may learn of the safety status of the battery pack, and the like. The cloud data center may further take specific measures based on the safety status of the battery pack, to implement the maintenance of the battery pack.

Figure 6:
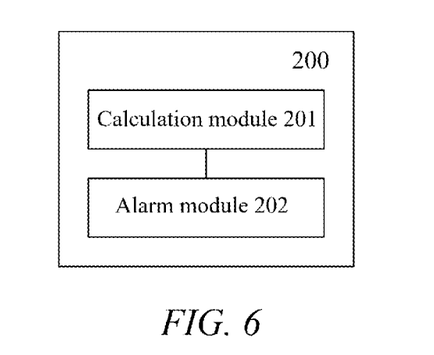
FIG. 6 is a schematic structural diagram of an apparatus for monitoring battery pack safety according to an embodiment of the present application.

The present application further provides an apparatus for monitoring battery pack safety. FIG. 6 is a schematic structural diagram of an apparatus for monitoring battery pack safety according to an embodiment of the present application. As shown in FIG. 6, the apparatus 200 for monitoring battery pack safety may include a calculation module 201 and an alarm module 202.

The calculation module 201 may be configured to obtain stress energy information of a battery pack in an electric vehicle based on obtained stress data of the battery pack.

The stress data is used to represent stress distribution of the bottom of the battery pack. The stress energy information is used to represent impact energy on the bottom of the battery pack.

In some examples, the stress data includes one or more of the following: fluctuation data, pressure data, and acceleration data. The fluctuation data is used to represent a mechanical wave impacting the bottom of the battery pack. The pressure data is used to represent force on the bottom of the battery pack. The acceleration data is used to represent acceleration of the battery pack in a direction perpendicular to the bottom of the battery pack.

In some examples, the stress energy information includes stress energy. In some other examples, the stress energy information may further include a stress position.

The alarm module 202 may be configured to determine a target-level alarm condition based on the stress energy information and send alarm information corresponding to the target-level alarm condition.

The target-level alarm condition is a level of alarm condition in preset N levels of alarm conditions that the stress energy information satisfies. An $i^{th}$ level of alarm condition in the N levels of alarm conditions includes that there are $m_i$ occurrences of the impact energy represented by the stress energy information that is within an $i^{th}$ energy threshold range, N is a positive integer, and $0 < i \leq N$.

When N is a positive integer greater than 1 and $1 < i \leq N$, a lower limit value of the $i^{th}$ energy threshold range corresponding to the $i^{th}$ level of alarm condition is greater than an upper limit value of an $(i-1)^{th}$ energy threshold range corresponding to an $(i-1)^{th}$ level of alarm condition, and $m_i < m_{i-1}$.

In this embodiment of the present application, the stress energy information for ensuring the energy generated by the force on the bottom of the battery pack is obtained based on the stress data of the battery pack that can ensure the stress distribution of the bottom of the battery pack. A level of alarm condition that the stress energy satisfies, that is, the target-level alarm condition, is determined based on the stress energy information, so that the alarm information corresponding to the target-level alarm condition is sent. If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

In some examples, the target-level alarm condition is the $i^{th}$ level of alarm condition.

The alarm module 202 may be configured to: when the impact energy represented by the obtained stress energy information is within the $i^{th}$ energy threshold range, obtain the cumulative number of risks corresponding to the $i^{th}$ energy threshold range, where the cumulative number of risks corresponding to the $i^{th}$ energy threshold range is used to indicate the number of occurrences of the impact energy represented by the stress energy information that is within the $i^{th}$ energy threshold range; and when the cumulative number of risks corresponding to the $i^{th}$ energy threshold range reaches send alarm information corresponding to the $i^{th}$ level of alarm condition.

In some examples, $m_N=1$.

In some examples, the calculation module 201 may be configured to: when the stress data exceeds a normal change threshold range, obtain the stress energy information of the battery pack based on the stress data.

Figure 7:
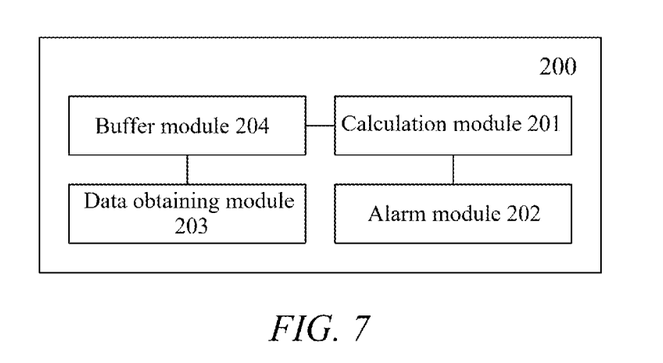
FIG. 7 is a schematic structural diagram of an apparatus for monitoring battery pack safety according to another embodiment of the present application.

FIG. 7 is a schematic structural diagram of an apparatus for monitoring battery pack safety according to another embodiment of the present application. A difference between FIG. 7 and FIG. 6 lies in that, the apparatus 200 for monitoring battery pack safety illustrated in FIG. 7 may further include a data obtaining module 203 and a buffer module 204.

The data obtaining module 203 may be configured to obtain stress data.

The buffer module 204 may be configured to: when the number of pieces of cached stress data is less than a predetermined number threshold, cache the stress data obtained this time; and when the number of pieces of cached stress data is greater than or equal to the predetermined number threshold, delete the first obtained stress data, and cache the stress data obtained this time.

Figure 8:
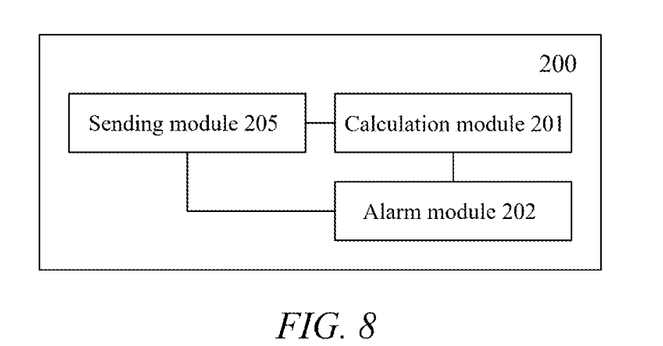
FIG. 8 is a schematic structural diagram of an apparatus for monitoring battery pack safety according to still another embodiment of the present application.

FIG. 8 is a schematic structural diagram of an apparatus for monitoring battery pack safety according to still another embodiment of the present application. A difference between FIG. 8 and FIG. 6 lies in that, the apparatus 200 for monitoring battery pack safety illustrated in FIG. 8 may further include a sending module 205.

The sending module 205 may be configured to upload safety status information of the battery pack to a cloud data center.

The safety status information of the battery pack includes the stress energy information and/or the alarm information corresponding to the target-level alarm condition.

Figure 9:
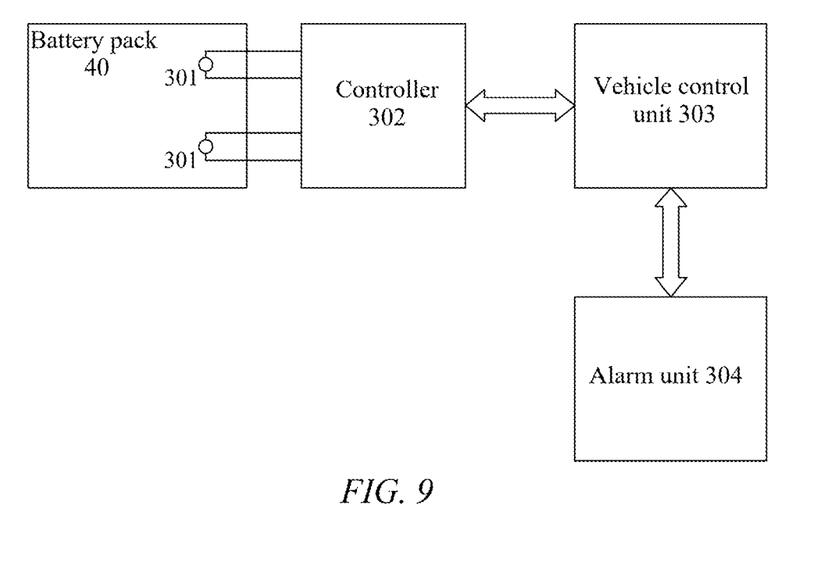
FIG. 9 is a schematic structural diagram of a system for monitoring battery pack safety according to an embodiment of the present application.

The present application provides a system for monitoring battery pack safety. FIG. 9 is a schematic structural diagram of a system for monitoring battery pack safety according to an embodiment of the present application. As shown in FIG. 9, the system for monitoring battery pack safety may include a sensor 301, a controller 302, and a vehicle control unit 303.

The sensor 301 may be provided at the bottom of a battery pack 40 and configured to collect stress data of the battery pack 40.

The battery pack is located in an electric vehicle. The stress data is used to represent stress distribution of the bottom of the battery pack 40. In some examples, the stress data includes one or more of the following: fluctuation data, pressure data, and acceleration data. The fluctuation data is used to represent a mechanical wave impacting the bottom of the battery pack 40. The pressure data is used to represent force on the bottom of the battery pack 40. The acceleration data is used to represent acceleration of the battery pack 40 in a direction perpendicular to the bottom of the battery pack 40. For specific contents such as arrangement and a type of the sensor 301, reference may be made to related descriptions of the foregoing embodiments, which is not repeated herein.

The controller 302 is communicatively connected to the sensor 301 and configured to obtain the stress data from the sensor and obtain stress energy information of the battery pack 40 based on the stress data. In some examples, the controller 302 may be specifically implemented as a microcontroller unit (MCU), which is not limited herein.

The stress energy information is used to represent impact energy on the bottom of the battery pack 40. In some examples, the stress energy information includes stress energy. In some other examples, the stress energy information may further include a stress position.

The vehicle control unit 303 is communicatively connected to the controller 302 and configured to determine a target-level alarm condition based on the stress energy information and send alarm information corresponding to the target-level alarm condition.

The target-level alarm condition is a level of alarm condition in preset N levels of alarm conditions that the stress energy information satisfies. An $i^{th}$ level of alarm condition in the N levels of alarm conditions includes that there are $m_i$ occurrences of the impact energy represented by the stress energy information that is within an $i^{th}$ energy threshold range, N is a positive integer, and $0<i\leq N$.

When N is a positive integer greater than 1 and $1<i\leq N$, a lower limit value of the $i^{th}$ energy threshold range corresponding to the $i^{th}$ level of alarm condition is greater than an upper limit value of an $(i-1)^{th}$ energy threshold range corresponding to an $(i-1)^{th}$ level of alarm condition, and $m_i<m_{i-1}$.

In some examples, as shown in FIG. 9, the system for monitoring battery pack safety may further include an alarm unit 304. The alarm unit 304 may be configured to send prompt information in response to the alarm information. Specifically, the alarm unit 304 may include a central control panel, a central control display screen, a buzzer, and the like, which is not limited herein. The alarm unit 304 may send prompt information by displaying an image or making a sound, and the form of the prompt information is not limited herein.

In this embodiment of the present application, the stress energy information for ensuring the energy generated by the force on the bottom of the battery pack is obtained based on the stress data of the battery pack that can ensure the stress distribution of the bottom of the battery pack. A level of alarm condition that the stress energy satisfies, that is, the target-level alarm condition, is determined based on the stress energy information, so that the alarm information corresponding to the target-level alarm condition is sent. If the stress energy information satisfies the $i^{th}$ level of alarm condition, there are $m_i$ occurrences of the impact energy represented by the stress energy information that is within the $i^{th}$ energy threshold range, which indicates that impacts on the battery pack that are within the $i^{th}$ energy threshold range are accumulated to a degree that the battery pack is severely damaged; and through alarm information corresponding to the specific level of alarm condition that the stress energy information satisfies, a prompt indicating that the battery pack has a safety risk may be provided, so that the safety risk of the battery pack can be found and handled in a timely manner, thereby improving the safety of the battery pack, and further avoiding damage to the electric vehicle and the driver caused due to battery pack fires and explosions.

The vehicle control unit 303 may be configured to: when the impact energy represented by the obtained stress energy information is within the $i^{th}$ energy threshold range, obtain the cumulative number of risks corresponding to the $i^{th}$ energy threshold range, where the cumulative number of risks corresponding to the $i^{th}$ energy threshold range is used to indicate the number of occurrences of the impact energy represented by the stress energy information that is within the $i^{th}$ energy threshold range; and when the cumulative number of risks corresponding to the $i^{th}$ energy threshold range reaches send alarm information corresponding to the $i^{th}$ level of alarm condition. The target-level alarm condition is the $i^{th}$ level of alarm condition.

In some examples, $m_N=1$.

In some examples, the controller 302 may be configured to: when the stress data exceeds a normal change threshold range, obtain the stress energy information of the battery pack based on the stress data.

In some examples, the controller 302 may be further configured to: obtain stress data; when the number of pieces of cached stress data is less than a predetermined number threshold, cache the stress data obtained this time; and when the number of pieces of cached stress data is greater than or equal to the predetermined number threshold, delete the first obtained stress data, and cache the stress data obtained this time.

Figure 10:
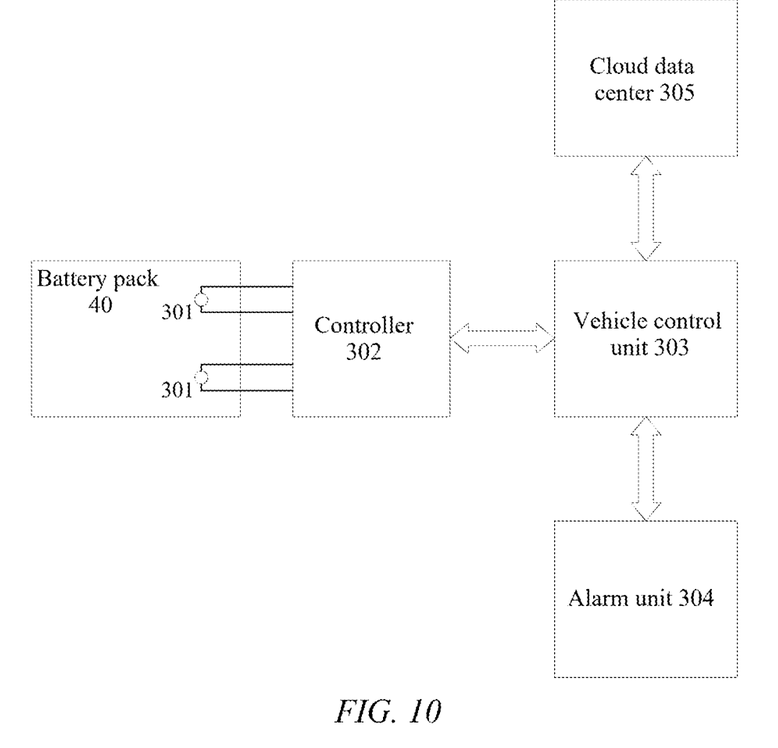
FIG. 10 is a schematic structural diagram of a system for monitoring battery pack safety according to another embodiment of the present application.

FIG. 10 is a schematic structural diagram of a system for monitoring battery pack safety according to another embodiment of the present application. A difference between FIG. 10 and FIG. 9 lies in that, the system for monitoring battery pack safety illustrated in FIG. 10 may further include a cloud data center 305.

The cloud data center 305 is communicatively connected to the vehicle control unit 303 and configured to obtain safety status information of the battery pack from the vehicle control unit.

The safety status information of the battery pack includes the stress energy information and/or the alarm information corresponding to the target-level alarm condition.

For specific contents of the system for monitoring battery pack safety that are related to the method for monitoring battery pack safety, reference may be made to related descriptions of the foregoing embodiments, which is not repeated herein.

Figure 11:
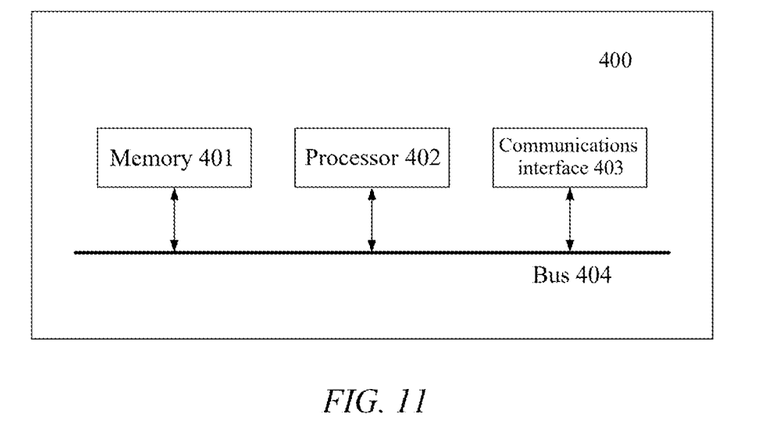
FIG. 11 is a schematic structural diagram of a device for monitoring battery pack safety according to an embodiment of the present application.

An embodiment of the present application further provides a device for monitoring battery pack safety. FIG. 11 is a schematic structural diagram of a device for monitoring battery pack safety according to an embodiment of the present application. As shown in FIG. 11, the device 400 for monitoring battery pack safety includes a memory 401, a processor 402, and a computer program that is stored in the memory 401 and that can run on the processor 402.

In an example, the processor 402 above may include a central processing unit (CPU), or an application-specific integrated circuit (ASIC), or may be one or more integrated circuits configured to implement the embodiments of the present application.

The memory 401 may include a read-only memory (ROM), a random access memory (RAM), a magnetic disk storage medium device, an optical storage medium device, a flash device, or an electrical, optical, or another physical/tangible memory storage device. Thus, the memory generally includes one or more tangible (non-transient) computer-readable storage media (for example, memory devices) encoded with software including computer executable instructions, and the software, when executed (for example, by one or a plurality of processors), is operable to perform the operations described with reference to the method for monitoring battery pack safety according to the present application.

The processor 402 reads executable program code stored in the memory 401 to execute a computer program corresponding to the executable program code, so as to implement the method for monitoring battery pack safety in the foregoing embodiments.

In an example, the device 400 for monitoring battery pack safety may further include a communications interface 403 and a bus 404. As shown in FIG. 11, the memory 401, the processor 402, and the communications interface 403 are connected through the bus 404 and complete communication with each other.

The communications interface 403 is mainly configured to implement communication between various modules, apparatuses, units and/or devices in the embodiments of the present application. Connection of an input device and/or an output device may also be implemented through the communications interface 403.

The bus 404 includes hardware, software, or both, and couples the components of the device 400 for monitoring battery pack safety to each other. As an example rather than a limitation, the bus 404 may include an accelerated graphics port (AGP) or other graphics buses, an enhanced industry standard architecture (EISA) bus, a front side bus (FSB), a hypertransport (HT) interconnect bus, an industry standard architecture (ISA) bus, an infinite bandwidth interconnect bus, a low pin count (LPC) bus, a memory bus, a micro channel architecture (MCA) bus, a peripheral component interconnect (PCI) bus, a PCI-Express (PCI-X) bus, a serial advanced technology attachment (SATA) bus, a video electronics standards association local bus (VLB), other suitable buses, or a combination of two or more of the foregoing. In an appropriate case, the bus 404 may include one or more buses. In the embodiments of the present application, a specific bus is described and shown, but any suitable bus or interconnection is considered in the present application.

An embodiment of the present application further provides a computer-readable storage medium storing computer program instructions, where the computer program instructions, when executed by a processor, may implement the method for monitoring battery pack safety in the foregoing embodiments and a same technical effect can be achieved. To avoid repetition, details are not described herein again. The computer-readable storage medium above may include a non-transient computer-readable storage medium, for example, a read-only memory (ROM), a random access memory (RAM), a magnetic disk, an optical disc, or the like, which is not limited herein.

An embodiment of the present application further provides an electric vehicle. The electric vehicle may include the device for monitoring battery pack safety in the foregoing embodiment. For specific contents, reference may be made to related contents in the foregoing embodiment, and details are not repeated herein.

It should be made clear that the embodiments in this specification are described in a progressive manner, and that the same or similar parts among the embodiments can be referred to each other. Each embodiment focuses on the differences from other embodiments. For related parts of the embodiments of the apparatus, the embodiments of the system, the embodiments of the device, the embodiments of the computer-readable storage medium, and the embodiments of the electric vehicle, reference may be made to the illustration section of the method embodiment. The present application is not limited to the specific steps and structures described above and shown in the figures. Those skilled in the art may make various changes, modifications, and additions, or change the sequence of the steps after understanding the spirit of the present application. In addition, for brevity, a detailed description of a known method technology is omitted herein.

Various aspects of the present application are described above with reference to the flowcharts and/or block diagrams of the methods, apparatuses (systems), and computer program products according to the embodiments of the present application. It should be understood that, each procedure and/or block in the flowchart and/or the block diagram as well as a combination of procedures and/or blocks in the flowchart and/or the block diagram may be implemented by computer program instructions. These computer program instructions may be provided for a general-purpose computer, a special-purpose computer, or a processor of any other programmable data processing apparatus to generate a machine, so that these instructions executed by a computer or a processor of any other programmable data processing apparatus can implement a specific function/action in one or more blocks in the flowcharts and/or the block diagrams. Such a processor may be, but is not limited to, a general-purpose processor, a special-purpose processor, an application-specific processor, or a field programmable logic circuit. It may also be understood that, each block and/or procedure in the block diagram and/or the flowchart as well as a combination of blocks and/or procedures in the block diagram and/or the flowchart may alternatively be implemented by special-purpose hardware for executing a specific function or action, or may be implemented by a combination of special-purpose hardware and computer instructions.

It should be understood by those skilled in the art that the foregoing embodiments are merely exemplary rather than restrictive. Different technical features in different embodiments may be combined to achieve beneficial effects. On the basis of studying the accompanying drawings, the specifications, and the claims, those skilled in the art, should be able to understand and implement other modified embodiments of the disclosed embodiments. In the claims, the term "comprise" does not exclude other apparatuses or steps; the indefinite article "one" does not exclude plural; and the terms "first" and "second" are used to indicate names rather than to indicate any particular order. None of the reference numerals in the claims shall be construed as limiting the protection scope. The functions of the multiple parts appearing in the claims may be implemented by a single hardware or software module. The appearance of certain technical features in different dependent claims does not mean that these technical features cannot be combined to achieve beneficial effects.

What is claimed is:

1. A method for monitoring battery pack safety during operation in an electric vehicle, comprising:
    determining an energy of an impact on a bottom of a battery pack in the electric vehicle based on obtained stress data of the battery pack, wherein the stress data includes force on a bottom of the battery pack and distribution of the force obtained based on data collected by a plurality of sensors provided at the bottom of the battery pack and positions of the plurality of sensors; and
    determining a target-level alarm condition based on the energy of the impact and generating alarm information corresponding to the target-level alarm condition, wherein the target-level alarm condition is a level of alarm condition in preset N levels of alarm conditions;
    wherein:
    $m_i < m_{i-1}$;
    $m_i$ is a number of occurrences of the energy of the impact being within an $i^{th}$ energy threshold range that satisfies an $i^{th}$ level of alarm condition in the N levels of alarm conditions, N is a positive integer greater than 1, and $0 < i \leq N$;
    $m_{i-1}$ is a number of occurrences of the energy of the impact being within an $(i-1)^{th}$ energy threshold range that satisfies an $(i-1)^{th}$ level of alarm condition in the N levels of alarm conditions; and
    a lower limit value of the $i^{th}$ energy threshold range is greater than an upper limit value of the $(i-1)^{th}$ energy threshold range.

2. The method according to claim 1, wherein the target-level alarm condition is the $i^{th}$ level of alarm condition; and
    the determining a target-level alarm condition based on the stress energy information and sending alarm information corresponding to the target-level alarm condition comprises:
    when the impact energy represented by the obtained stress energy information is within the $i^{th}$ energy threshold range, obtaining the cumulative number of risks corresponding to the $i^{th}$ energy threshold range, wherein the cumulative number of risks corresponding to the $i^{th}$ energy threshold range is used to indicate the number of occurrences of the impact energy represented by the stress energy information that is within the $i^{th}$ energy threshold range; and
    when the cumulative number of risks corresponding to the $i^{th}$ energy threshold range reaches $m_i$, sending alarm information corresponding to the $i^{th}$ level of alarm condition.

3. The method according to claim 1, wherein $m_N=1$, and $m_N$ is a number of occurrences of the energy of the impact being within an $N^{th}$ energy threshold range that satisfies an $N^{th}$ level of alarm condition in the N levels of alarm conditions.

4. The method according to claim 1, wherein the obtaining stress energy information of a battery pack in the electric vehicle based on obtained stress data of the battery pack comprises:
    when the stress data exceeds a normal change threshold range, obtaining the stress energy information of the battery pack based on the stress data.

5. The method according to claim 1, wherein before the obtaining stress energy information of a battery pack in the electric vehicle based on obtained stress data of the battery pack, the method further comprises:
    obtaining the stress data;
    when a number of pieces of cached stress data is less than a predetermined number threshold, caching the stress data obtained; and
    when a number of pieces of cached stress data is greater than or equal to the predetermined number threshold, deleting the first obtained stress data and caching the stress data obtained.

6. The method according to claim 1, wherein the stress data comprises one or more of the following:
    fluctuation data, pressure data, and acceleration data, wherein
    the fluctuation data is used to represent a mechanical wave impacting the bottom of the battery pack, the pressure data is used to represent force on the bottom of the battery pack, and the acceleration data is used to represent acceleration of the battery pack in a direction perpendicular to the bottom of the battery pack.

7. The method according to claim 1, further comprising:
    uploading safety status information of the battery pack to a cloud data center, wherein the safety status information of the battery pack comprises the stress energy information and/or the alarm information corresponding to the target-level alarm condition.

8. The method according to claim 1, wherein the stress energy information comprises stress energy, and the stress energy information further comprises a stress position.

9. An apparatus for monitoring battery pack safety during operation in an electric vehicle, comprising:
    a calculation module configured to determine an energy of an impact on a bottom of a battery pack in the electric vehicle based on obtained stress data of the battery pack, wherein the stress data includes force on a bottom of the battery pack and distribution of the force obtained based on data collected by a plurality of sensors provided at the bottom of the battery pack and positions of the plurality of sensors; and
    an alarm module configured to determine a target-level alarm condition based on the energy of the impact and generate alarm information corresponding to the target-level alarm condition, wherein the target-level alarm condition is a level of alarm condition in preset N levels of alarm conditions;
    wherein:
    $m_i < m_{i-1}$;
    $m_i$ is a number of occurrences of the energy of the impact being within an $i^{th}$ energy threshold range that satisfies an $i^{th}$ level of alarm condition in the N levels of alarm conditions, N is a positive integer greater than 1, and $0 < i \leq N$;
    $m_{i-1}$ is a number of occurrences of the energy of the impact being within an $(i-1)^{th}$ energy threshold range that satisfies an $(i-1)^{th}$ level of alarm condition in the N levels of alarm conditions; and
a lower limit value of the $i^{th}$ energy threshold range is greater than an upper limit value of the $(i-1)^{th}$ energy threshold range.

10. A system for monitoring battery pack safety during operation in an electric vehicle, comprising:
a plurality of sensors provided at a bottom of a battery pack and configured to collect stress data of the battery pack, wherein the stress data includes force on the bottom of the battery pack and distribution of the force, the battery pack is located in the electric vehicle, and the stress distribution is obtained based on data collected by the plurality of sensors and positions of the plurality of sensors;
a controller communicatively connected to the sensor and configured to obtain the stress data from the sensor and determining an energy of an impact on the bottom of the battery pack based on the stress data; and
a vehicle control unit communicatively connected to the controller and configured to determine a target-level alarm condition based on the energy of the impact and generate alarm information corresponding to the target-level alarm condition, wherein the target-level alarm condition is a level of alarm condition in preset N levels of alarm conditions;
wherein:
$m_i < m_{i-1}$;
$m_i$ is a number of occurrences of the energy of the impact being within an $i^{th}$ energy threshold range that satisfies an $i^{th}$ level of alarm condition in the N levels of alarm conditions, N is a positive integer greater than 1, and $0 < i \leq N$;
$m_{i-1}$ is a number of occurrences of the energy of the impact being within an $(i-1)^{th}$ energy threshold range that satisfies an $(i-1)^{th}$ level of alarm condition in the N levels of alarm conditions; and
a lower limit value of the $i^{th}$ energy threshold range is greater than an upper limit value of the $(i-1)^{th}$ energy threshold range.

11. The system according to claim 10, further comprising:
a cloud data center communicatively connected to the vehicle control unit and configured to obtain safety status information of the battery pack from the vehicle control unit, wherein the safety status information of the battery pack comprises the stress energy information and/or the alarm information corresponding to the target-level alarm condition.

12. A device for monitoring battery pack safety, comprising: a processor and a memory storing computer program instructions, wherein
the computer program instructions, when executed by the processor, implement the method for monitoring battery pack safety according to claim 1.

13. A non-transitory computer-readable storage medium storing computer program instructions, wherein the computer program instructions, when executed by a processor of a device, cause the device to implement the method for monitoring battery pack safety according to claim 1.

* * * * *